US012774400B2

(12) United States Patent
Masuda et al.

(10) Patent No.: US 12,774,400 B2
(45) Date of Patent: Oct. 27, 2026

(54) POSITIVELY CHARGED ABRASIVE WITH NEGATIVELY CHARGED IONIC OXIDIZER FOR POLISHING APPLICATION

(71) Applicant: CMC Materials LLC, Aurora, IL (US)

(72) Inventors: Tsuyoshi Masuda, Tsu (JP); Ryuta Kumashiro, Tsu (JP); Hironao Fujii, Tsu (JP); Takamasa Kanai, Tsu (JP); Hiroshi Kitamura, Tsu (JP); Helin Huang, Aurora, IL (US); Yoshiyuki Matsumura, Kashihara (JP)

(73) Assignee: CMC Materials LLC, Aurora, IL (US)

( * ) Notice: Subject to any disclaimer, the term of this patent is extended or adjusted under 35 U.S.C. 154(b) by 235 days.

(21) Appl. No.: 18/385,340

(22) Filed: Oct. 30, 2023

(65) Prior Publication Data

US 2024/0150614 A1 May 9, 2024

Related U.S. Application Data

(60) Provisional application No. 63/424,052, filed on Nov. 9, 2022.

(51) Int. Cl.

| | |
|---|---|
| ***H10P 52/40*** | (2026.01) |
| ***B24B 1/00*** | (2006.01) |
| ***B24B 37/04*** | (2012.01) |
| ***C09G 1/00*** | (2006.01) |
| ***C09G 1/02*** | (2006.01) |

(Continued)

(52) U.S. Cl.

CPC .................. *C09G 1/02* (2013.01); *B24B 1/00* (2013.01); *B24B 37/044* (2013.01); *C09G 1/00* (2013.01); *C09K 3/1436* (2013.01); *C09K 3/1463* (2013.01); *C09K 13/00* (2013.01); *C09K 13/04* (2013.01); *H10P 52/402* (2026.01); *H10P 52/403* (2026.01); *H10P 70/237* (2026.01); *H10P 90/129* (2026.01); *H10P 95/06* (2026.01)

(58) Field of Classification Search

None

See application file for complete search history.

(56) References Cited

U.S. PATENT DOCUMENTS

| | | | |
|---|---|---|---|
| 2008/0057713 A1 | 3/2008 | Desai et al. | |
| 2014/0094032 A1 | 4/2014 | Yoshida et al. | |

(Continued)

FOREIGN PATENT DOCUMENTS

| | | |
|---|---|---|
| CN | 114410226 A | 4/2022 |
| WO | 2006052434 A1 | 5/2006 |

OTHER PUBLICATIONS

NPL—Google Search on Mohs Hardness, a Google Search result on "Mohs hardness of colloidal silica surface modified by aminosilane" conducted on Nov. 10, 2025 (Year: 2025).*

*Primary Examiner* — Jiong-Ping Lu

(57) ABSTRACT

The invention provides a chemical-mechanical polishing composition comprising: (a) an abrasive particle; (b) an ionic oxidizer; and (c) water, wherein the chemical-mechanical polishing composition has a pH of about 1 to about 7, the abrasive particle has an isoelectric point that is higher than 8, and the ionic oxidizer has a negative charge at the pH of the chemical-mechanical polishing composition. The invention also provides a method of chemically-mechanically polishing a substrate, especially a substrate comprising a silicon carbide layer on a surface of the substrate, using said composition.

10 Claims, 7 Drawing Sheets

(51) Int. Cl.

| | |
|---|---|
| ***C09K 3/14*** | (2006.01) |
| ***C09K 13/00*** | (2006.01) |
| ***C09K 13/04*** | (2006.01) |
| ***H10P 70/00*** | (2026.01) |
| ***H10P 90/00*** | (2026.01) |
| ***H10P 95/00*** | (2026.01) |

(56) References Cited

U.S. PATENT DOCUMENTS

| | | | | |
|---|---|---|---|---|
| 2015/0315441 | A1 | 11/2015 | Haerle | |
| 2017/0107404 | A1 | 4/2017 | Kim | |
| 2019/0106596 | A1 | 4/2019 | Mishra | |
| 2020/0172760 | A1 | 6/2020 | Kraft et al. | |
| 2022/0112401 | A1* | 4/2022 | Kim | H01L 21/304 |
| 2022/0306902 | A1 | 9/2022 | Alety | |
| 2024/0400862 | A1* | 12/2024 | Mori | C09K 3/14 |

* cited by examiner

POSITIVELY CHARGED ABRASIVE WITH NEGATIVELY CHARGED IONIC OXIDIZER FOR POLISHING APPLICATION

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

The next generation of semiconductor devices incorporates the use of materials with greater hardness and other desirable properties for high power, high temperature, and high frequency operation applications. Such materials may include silicon carbide and/or silicon nitride. Of these materials, silicon carbide is a material with a desirable combination of electrical and thermo-physical properties, including high practical operating temperature, good corrosion resistance, and high thermal properties. However, silicon carbide is significantly harder and more chemically inert than other materials utilized in integrated circuits.

In view of the foregoing, polishing of silicon carbide can be challenging and exhibit low removal rates. As a result, conventional polishing compositions for polishing silicon carbide often utilize hard abrasives. While these hard abrasives can provide effectively high removal rates, they often result in increased scratching and inferior roughness properties on the silicon carbide surface.

Accordingly, there is an ongoing need to develop new polishing methods and compositions that provide relatively high removal rates for silicon carbide and reduce the prevalence of surface defects such as scratching and roughness.

BRIEF SUMMARY OF THE INVENTION

The invention provides a chemical-mechanical polishing composition comprising: (a) an abrasive particle; (b) an ionic oxidizer; and (c) water, wherein the chemical-mechanical polishing composition has a pH of about 1 to about 7, the abrasive particle has an isoelectric point that is higher than 8, and the ionic oxidizer has a negative charge at the pH of the chemical-mechanical polishing composition.

The invention further provides a method of chemically-mechanically polishing a substrate comprising: (i) providing a substrate, (ii) providing a polishing pad, (iii) providing a chemical-mechanical polishing composition comprising: (a) an abrasive particle; (b) an ionic oxidizer; and (c) water, the chemical-mechanical polishing composition has a pH of about 1 to about 7, the abrasive particle has an isoelectric point that is higher than 8, and the ionic oxidizer has a negative charge at the pH of the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

DETAILED DESCRIPTION OF THE INVENTION

Figure 1:
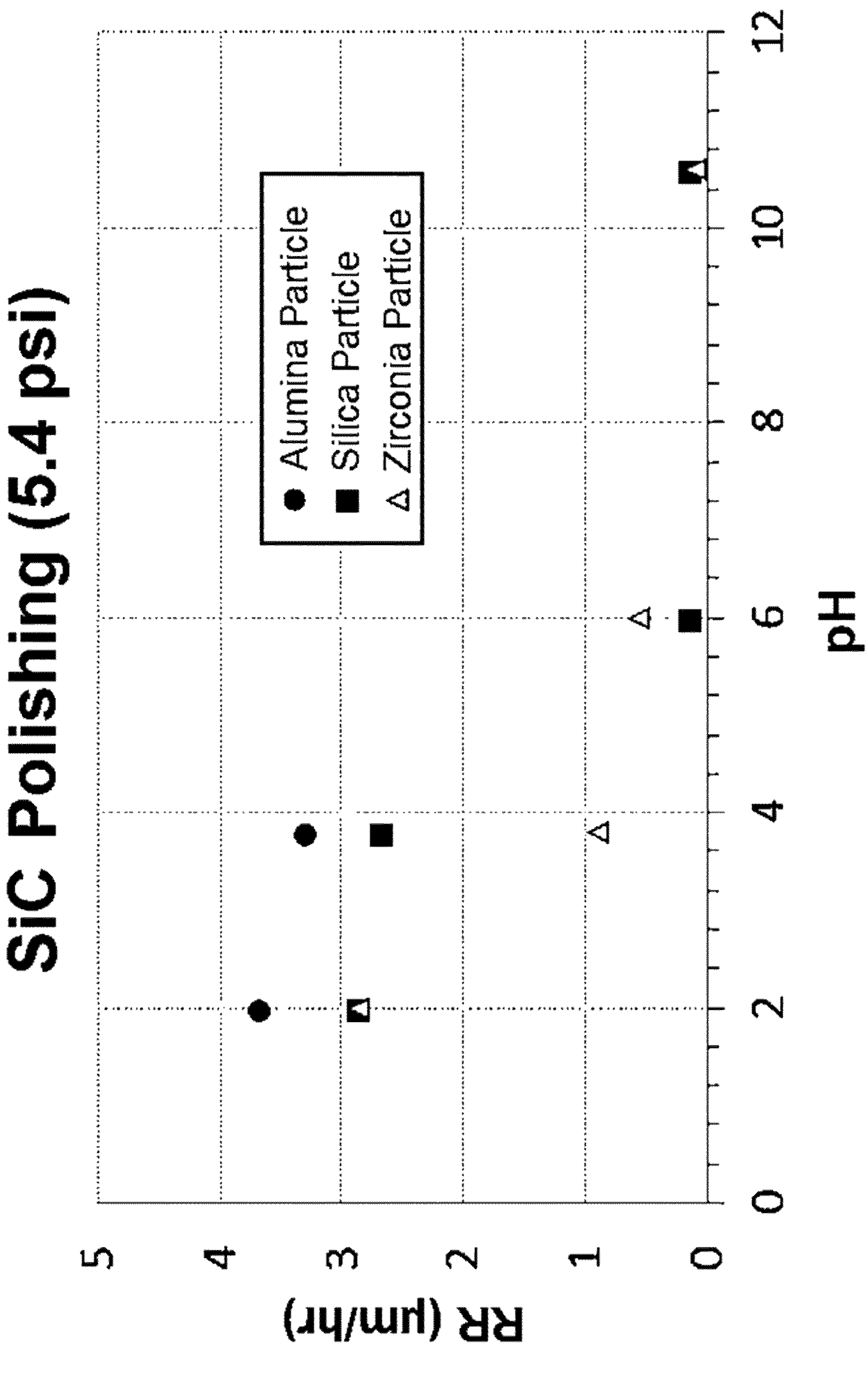
FIG. 1 shows the silicon carbide (SiC) removal rate (μm/hr) at 5.4 psi for an aluminum particle, silica particle, and zirconia particle, as described in Example 1.

The invention provides a chemical-mechanical polishing composition comprising: (a) an abrasive particle; (b) an ionic oxidizer; and (c) water, wherein the chemical-mechanical polishing composition has a pH of about 1 to about 7, the abrasive particle has an isoelectric point that is higher than 8, and the ionic oxidizer has a negative charge at the pH of the chemical-mechanical polishing composition.

The polishing composition comprises an abrasive particle. As used herein, the terms "abrasive" and "abrasive particle" can be used interchangeably, and can refer to any dispersion of abrasive particles. In other words the terms "abrasive" and "abrasive particle" can be used interchangeably, and can refer to (i) a plurality of a single type of abrasive or abrasive particle or (ii) a plurality of more than one type of abrasive or abrasive particle.

The abrasive particle has an isoelectric point that is higher than 8. In other words, the abrasive particle has an isoelectric point that is higher than the pH of the chemical-mechanical polishing composition. As used herein, the term "isoelectric point" refers the pH at which the abrasive particle carries no net electrical charge or is electrically neutral in the statistical mean. The abrasive particle can have an isoelectric point of about 8.2 or more, for example, about 8.4 or more, about 8.5 or more, about 8.6 or more, about 8.8 or more, or about 9 or more. Alternatively, or in addition, the abrasive particle can have an isoelectric point of about 12 or less, for example, about 11.5 or less, about 11 or less, about 10.5 or less, about 10 or less, about 9.5 or less, or about 9 or less. Thus, the abrasive particle can have an isoelectric point bounded by any two of the aforementioned endpoints, as appropriate.

For example, in some embodiments, the abrasive particle can have an isoelectric point of about 8.2 to about 12, for example, about 8.2 to about 11.5, about 8.2 to about 11, about 8.2 to about 10.5, about 8.2 to about 10, about 8.2 to about 9.5, about 8.2 to about 9, about 8.4 to about 12, about 8.4 to about 11.5, about 8.4 to about 11, about 8.4 to about 10.5, about 8.4 to about 10, about 8.4 to about 9.5, about 8.4 to about 9, about 8.5 to about 12, about 8.5 to about 11.5, about 8.5 to about 11, about 8.5 to about 10.5, about 8.5 to about 10, about 8.5 to about 9.5, about 8.5 to about 9, about 8.6 to about 12, about 8.6 to about 11.5, about 8.6 to about 11, about 8.6 to about 10.5, about 8.6 to about 10, about 8.6 to about 9.5, about 8.6 to about 9, about 8.8 to about 12, about 8.8 to about 11.5, about 8.8 to about 11, about 8.8 to about 10.5, about 8.8 to about 10, about 8.8 to about 9.5, about 8.8 to about 9, about 9 to about 12, about 9 to about 11.5, about 9 to about 11, about 9 to about 10.5, about 9 to about 10, or about 9 to about 9.5. In some embodiments, the abrasive particle has an isoelectric point of about 8.2 to about 11 or about 8.5 to about 10. In certain embodiments, the abrasive particle has an isoelectric point of about 8.8 to about 9.5.

The abrasive particle can comprise any suitable metal and/or metalloid so long as the abrasive particle is hard enough to provide an adequate removal rate, but soft enough to produce few surface defects (e.g., less scratches, superior roughness quality, etc.). For example, the abrasive particle can comprise silica, zirconia, ceria, or a combination thereof. In some embodiments, the abrasive particle has a Mohs hardness of about 7 or less (e.g., about 6.8 or less, about 6.6 or less, about 6.4 or less, about 6.2 or less, about 6 or less, about 5.8 or less, or about 5.6 or less). In certain embodiments, the abrasive particle has a Mohs hardness of about 6 or less. Alternatively, or in addition, the abrasive particle has a Mohs hardness of about 3 or more, for example, about 3.5 or more, about 4 or more, about 4.5 or more, or about 5 or more. Thus, the abrasive particle can have a Mohs hardness bounded by any two of the aforementioned endpoints, as appropriate.

For example, in some embodiments, the abrasive particle can have a Mohs hardness of about 3 to about 7, for example, about 3.5 to about 7, about 4 to about 7, about 4.5 to about 7, about 5 to about 7, about 3 to about 6.8, about 3.5 to about 6.8, about 4 to about 6.8, about 4.5 to about 6.8, about 5 to about 6.8, about 3 to about 6.6, about 3.5 to about 6.6, about 4 to about 6.6, about 4.5 to about 6.6, about 5 to about 6.6, about 3 to about 6.4, about 3.5 to about 6.4, about 4 to about 6.4, about 4.5 to about 6.4, about 5 to about 6.4, about 3 to about 6.2, about 3.5 to about 6.2, about 4 to about 6.2, about 4.5 to about 6.2, about 5 to about 6.2, about 3 to about 6, about 3.5 to about 6, about 4 to about 6, about 4.5 to about 6, or about 5 to about 6.

In some embodiments, the abrasive particle comprises a metal and/or metalloid other than silicon, zirconium, or cerium. For example, the abrasive particle can further comprise aluminum (e.g., aluminum-doped or aluminum coated). In some embodiments, the abrasive particle (e.g., silica particle or colloidal silica particle) is aluminum-doped and/or has a thin layer alumina cover.

The abrasive particle (e.g., silica particle or colloidal silica particle) can be modified (e.g., surface modified) or unmodified, and can have a negative native zeta potential or a positive native zeta potential. As used herein, the phrase "native zeta potential" refers to the zeta potential of the abrasive particle prior to adding the abrasive particle to the polishing composition. For example, the native zeta potential can refer to the zeta potential of an abrasive particle prior to adding the abrasive particle to the polishing composition as measured in a storage solution or an aqueous solution.

The charge on dispersed particles such as an abrasive particle (e.g., silica particle or colloidal silica particle) is commonly referred to as the zeta potential (or the electrokinetic potential). The zeta potential of a particle refers to the electrical potential difference between the electrical charge of the ions surrounding the particle and the electrical charge of the bulk solution of the composition in which it is measured (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). A skilled artisan will be able to determine whether the abrasive particle, prior to adding the abrasive particle to the polishing composition, has a negative native zeta potential or a positive native zeta potential. The native zeta potential and the zeta potential of the polishing composition may be obtained using the Model DT-1202 Acoustic and Electro-acoustic spectrometer available from Dispersion Technologies, Inc. (Bedford Hills, N.Y.). As used herein, the phase "positive zeta potential" refers to a silica abrasive that exhibits a positive surface charge when measured in the polishing composition.

Generally, the abrasive particle (e.g., silica particle or colloidal silica particle) has a positive zeta potential in the chemical-mechanical polishing composition. In other words, the abrasive particle has a zeta potential of greater than 0 mV in the chemical-mechanical polishing composition. In some embodiments, the abrasive particle has a zeta potential of greater than about +5 mV in the chemical-mechanical polishing composition, for example, greater than about +10 mV, greater than about +15 mV, greater than about +20 mV, greater than about +25 mV, greater than about +30 mV, greater than about +35 mV, greater than about +40 mV, greater than about +45 mV, or greater than about +50 mV in the chemical-mechanical polishing composition. In some embodiments, the abrasive particle has a zeta potential of greater than about +10 mV in the chemical-mechanical polishing composition. In certain embodiments, the abrasive particle has a zeta potential of greater than about +20 mV in the chemical-mechanical position composition. In preferred embodiments, the abrasive particle has a zeta potential of greater than about +40 mV in the chemical mechanical polishing composition.

In some embodiments, the abrasive particle comprises silica. In other words, the polishing composition can comprise a silica abrasive. As used herein, the terms "silica abrasive," "silica abrasive particle," "silica particle," and "abrasive particle" can be used interchangeably, and can refer to any silica particle (e.g., colloidal silica particle).

The silica abrasive (e.g., colloidal silica particle) can be modified (e.g., surface modified) or unmodified, and have a negative native zeta potential or a positive native zeta potential. Thus, the silica abrasive (e.g., colloidal silica particle) can have a positive zeta potential or a negative zeta potential prior to addition to the chemical-mechanical polishing composition. For example, the silica particle (e.g., colloidal silica particle) can have a native zeta potential of less than 0 mV (e.g., −5 mV, or lower) prior to addition to the chemical-mechanical polishing composition. Alternatively, the silica particle (e.g., colloidal silica particle) can have a native zeta potential of 0 mV or more (e.g., 5 mV, or more) prior to addition to the chemical-mechanical polishing composition.

Silica particles (e.g., colloidal silica particles) and charged silica particles (e.g., colloidal silica particles) can be prepared by various methods, some examples of which are commercially used and known. Useful silica particles include precipitated or condensation-polymerized silica, which may be prepared using known methods, such as by methods referred to as the "sol gel" method or by silicate ion-exchange. Condensation-polymerized silica particles are often prepared by condensing $Si(OH)_4$ to form substantially spherical (e.g., spherical, ovular, or oblong) particles. The precursor $Si(OH)_4$ may be obtained, for example, by hydrolysis of high purity alkoxysilanes, or by acidification of aqueous silicate solutions. U.S. Pat. No. 5,230,833 describes a method for preparing colloidal silica particles in solution.

In some embodiments, the silica abrasive is colloidal silica. As known to one of ordinary skill in the art, colloidal silicas are suspensions of fine amorphous, nonporous and typically spherical particles in a liquid phase. The colloidal silica can take the form of condensation-polymerized or precipitated silica particles. In some embodiments, the silica is in the form of wet-process type silica particles. The particles, e.g., colloidal silica, can have any suitable average size (i.e., average particle diameter). If the average abrasive particle size is too small, the polishing composition may not exhibit sufficient removal rate. In contrast, if the average abrasive particle size is too large, the polishing composition may exhibit undesirable polishing performance such as, for example, poor substrate defectivity.

Accordingly, the abrasive particle (e.g., silica particles or colloidal silica particles) can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the abrasive particle (e.g., silica particles or colloidal silica particles) can have an average particle size of about 200 nm or less, for example, about 175 nm or less, about 150 nm or less, about 125 nm or less, about 100 nm or less, about 75 nm or less, about 50 nm or less, or about 40 nm or less. Thus, the abrasive particle (e.g., silica particles or colloidal silica particles) can have an average particle size bounded by any two of the aforementioned endpoints.

For example, the abrasive particle (e.g., silica particles or colloidal silica particles) can have an average particle size of about 10 nm to about 200 nm, about 20 nm to about 200 nm, about 20 nm to about 175 nm, about 20 nm to about 150 nm, about 25 nm to about 125 nm, about 25 nm to about 100 nm, about 30 nm to about 100 nm, about 30 nm to about 75 nm, about 30 nm to about 40 nm, or about 50 nm to about 100 nm. For non-spherical abrasive particles (e.g., silica particles or colloidal silica particles), the size of the particle is the diameter of the smallest sphere that encompasses the particle. The particle size of the abrasive can be measured using any suitable technique, for example, using laser diffraction techniques. Suitable particle size measurement instruments are available from e.g., Malvern Instruments (Malvern, UK).

The abrasive particle (e.g., silica particles or colloidal silica particles) preferably is colloidally stable in the polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of [B]−[T]/[C] is less than or equal to 0.3, and most preferably is less than or equal to 0.1.

The abrasive particle (e.g., silica particles or colloidal silica particles) can be present in the polishing composition in any suitable amount. If the polishing composition of the invention comprises too little abrasive, the composition may not exhibit sufficient removal rate. In contrast, if the polishing composition comprises too much abrasive then the polishing composition may exhibit undesirable polishing performance and/or may not be cost effective and/or may lack stability. The polishing composition can comprise about 10 wt. % or less of the abrasive particle (e.g., silica particles or colloidal silica particles), for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less of the abrasive particle (e.g., silica particles or colloidal silica particles). Alternatively, or in addition, the polishing composition can comprise about 0.001 wt. % or more of the abrasive particle (e.g., silica particles or colloidal silica particles), for example, about 0.005 wt. % or more, about 0.01 wt. % or more, 0.05 wt. % or more, about 0.1 wt. % or more, about 0.2 wt. % or more, about 0.3 wt. % or more, about 0.4 wt. % or more, about 0.5 wt. % or more, or about 1 wt. % or more of the abrasive particle (e.g., silica particles or colloidal silica particles). Thus, the polishing composition can comprise abrasive particle (e.g., silica particles or colloidal silica particles) in an amount bounded by any two of the aforementioned endpoints, as appropriate.

For example, in some embodiments, the abrasive particle (e.g., silica particles or colloidal silica particles) can be present in the polishing composition in an amount of about 0.001 wt. % to about 10 wt. % of the polishing composition, e.g., about 0.001 wt. % to about 8 wt. %, about 0.001 wt. % to about 6 wt. %, about 0.001 wt. % to about 5 wt. %, about 0.001 wt. % to about 4 wt. %, about 0.001 wt. % to about 2 wt. %, about 0.001 wt. % to about 1 wt. %, about 0.01 wt. % to about 10 wt. %, about 0.01 wt. % to about 8 wt. %, about 0.01 wt. % to about 6 wt. %, about 0.01 wt. % to about 5 wt. %, about 0.01 wt. % to about 4 wt. %, about 0.01 wt. % to about 2 wt. %, about 0.01 wt. % to about 1 wt. %, about 0.05 wt. % to about 10 wt. %, about 0.05 wt. % to about 8 wt. %, about 0.05 wt. % to about 6 wt. %, about 0.05 wt. % to about 5 wt. %, about 0.05 wt. % to about 4 wt. %, about 0.05 wt. % to about 2 wt. %, about 0.05 wt. % to about 1 wt. %, about 0.1 wt. % to about 10 wt. %, about 0.1 wt. % to about 8 wt. %, about 0.1 wt. % to about 6 wt. %, about 0.1 wt. % to about 5 wt. %, about 0.1 wt. % to about 4 wt. %, about 0.1 wt. % to about 2 wt. %, about 0.1 wt. % to about 1 wt. %, about 0.5 wt. % to about 10 wt. %, about 0.5 wt. % to about 8 wt. %, about 0.5 wt. % to about 5 wt. %, about 0.5 wt. % to about 4 wt. %, about 0.5 wt. % to about 2 wt. %, about 0.5 wt. % to about 1 wt. %, about 1 wt. % to about 10 wt. %, about 1 wt. % to about 8 wt. %, about 1 wt. % to about 6 wt. %, about 1 wt. % to about 5 wt. %, about 1 wt. % to about 4 wt. %, or about 1 wt. % to about 2 wt. %. In some embodiments, the polishing composition comprises about 0.001 wt. % to about 10 wt. % of the abrasive particle (e.g., silica particles or colloidal silica particles). In certain embodiments, the polishing composition comprises about 0.05 wt. % to about 5 wt. % of the abrasive particle (e.g., silica particles or colloidal silica particles).

The chemical-mechanical polishing composition comprises an ionic oxidizer. The ionic oxidizer can be any suitable compound capable of oxidizing a substrate, which has a negative charge at the pH of the chemical-mechanical polishing composition. For example, the ionic oxidizer can be oxone, cerium ammonium nitrate, a periodate (e.g., sodium periodate or potassium periodate), an iodate (e.g., sodium iodate, potassium iodate, or ammonium iodate), a persulfate (e.g., sodium persulfate, potassium persulfate, or ammonium persulfate), a chlorate (e.g., sodium chlorate or potassium chlorate), a chromate (e.g., sodium chromate or potassium chromate), a permanganate (e.g., sodium permanganate, potassium permanganate, or ammonium permanganate), a bromate (e.g., sodium bromate or potassium bromate), a perbromate (e.g., sodium perbromate or potassium perbromate), a ferrate (e.g., potassium ferrate), a perrhenate (e.g., ammonium perrhenate), a perruthenate (e.g., tetrapropylammonium perruthenate), or a combination thereof. The ionic oxidizer can be in acid form (e.g., persulfuric acid), salt form (e.g., ammonium persulfate), or a mixture thereof prior to addition to the chemical-mechanical polishing composition. In some embodiments, the ionic oxidizer comprises the alkali metal (e.g., sodium or potassium) salt of a periodate, an iodate, a persulfate, a chlorate, a chromate, a permanganate, a bromate, a perbromate, a ferrate, a perrhenate, a perruthenate, or a combination thereof.

In some embodiments, the ionic oxidizer is a periodate (e.g., sodium periodate or potassium periodate), a persulfate (e.g., sodium persulfate, potassium persulfate, or ammonium persulfate), a permanganate (e.g., sodium permanganate, potassium permanganate, or ammonium permanganate), or a combination thereof. In certain embodiments, the ionic oxidizer comprises potassium persulfate, potassium permanganate, periodic acid, or a combination thereof.

The polishing composition can comprise any suitable amount of the ionic oxidizer. The polishing composition can comprise about 20 wt. % or less of the ionic oxidizer, for example, about 15 wt. % or less, about 10 wt. % or less, about 9 wt. % or less, about 8 wt. % or less, about 7 wt. % or less, about 6 wt. % or less, about 5 wt. % or less, about 4 wt. % or less, about 3 wt. % or less, or about 2 wt. % or less of the ionic oxidizer. Alternatively, or in addition, the polishing composition can comprise about 0.1 wt. % or more of the ionic oxidizer, for example, about 0.2 wt. % or more, about 0.3 wt. % or more, about 0.4 wt. % or more, or about 0.5 wt. % or more of the ionic oxidizer. Thus, the polishing composition can comprise the ionic oxidizer in an amount bounded by any two of the aforementioned endpoints, as appropriate.

For example, in some embodiments, the ionic oxidizer can be present in the polishing composition in an amount of about 0.1 wt. % to about 20 wt. %, about 0.1 wt. % to about 15 wt. %, about 0.1 wt. % to about 10 wt. %, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. %, about 0.1 wt. % to about 4 wt. %, about 0.1 wt. % to about 3 wt. %, about 0.1 wt. % to about 2 wt. %, about 0.2 wt. % to about 20 wt. %, about 0.2 wt. % to about 15 wt. %, about 0.2 wt. % to about 10 wt. %, about 0.2 wt. % to about 9 wt. %, about 0.2 wt. % to about 8 wt. %, about 0.2 wt. % to about 7 wt. %, about 0.2 wt. % to about 6 wt. %, about 0.2 wt. % to about 5 wt. %, about 0.2 wt. % to about 4 wt. %, about 0.2 wt. % to about 3 wt. %, about 0.2 wt. % to about 2 wt. %, about 0.3 wt. % to about 20 wt. %, about 0.3 wt. % to about 15 wt. %, about 0.3 wt. % to about 10 wt. %, about 0.3 wt. % to about 9 wt. %, about 0.3 wt. % to about 8 wt. %, about 0.3 wt. % to about 7 wt. %, about 0.3 wt. % to about 6 wt. %, about 0.3 wt. % to about 5 wt. %, about 0.3 wt. % to about 4 wt. %, about 0.3 wt. % to about 3 wt. %, about 0.3 wt. % to about 2 wt. %, about 0.4 wt. % to about 20 wt. %, about 0.4 wt. % to about 15 wt. %, about 0.4 wt. % to about 10 wt. %, about 0.4 wt. % to about 9 wt. %, about 0.4 wt. % to about 8 wt. %, about 0.4 wt. % to about 7 wt. %, about 0.4 wt. % to about 6 wt. %, about 0.4 wt. % to about 5 wt. %, about 0.4 wt. % to about 4 wt. %, about 0.4 wt. % to about 3 wt. %, about 0.4 wt. % to about 2 wt. %, about 0.5 wt. % to about 20 wt. %, about 0.5 wt. % to about 15 wt. %, about 0.5 wt. % to about 10 wt. %, about 0.5 wt. % to about 9 wt. %, about 0.5 wt. % to about 8 wt. %, about 0.5 wt. % to about 7 wt. %, about 0.5 wt. % to about 6 wt. %, about 0.5 wt. % to about 5 wt. %, about 0.5 wt. % to about 4 wt. %, about 0.5 wt. % to about 3 wt. %, or about 0.5 wt. % to about 2 wt. %. In some embodiments, the polishing composition comprises about 0.1 wt. % to about 2 wt. % of the ionic oxidizer.

The polishing composition comprises water. The water can be any suitable water and can be, for example, deionized water or distilled water. In some embodiments, the polishing composition can further comprise one or more organic solvents in combination with the water. For example, the polishing composition can further comprise a hydroxylic solvent such as methanol or ethanol, a ketonic solvent, an amide solvent, a sulfoxide solvent, and the like.

The chemical-mechanical polishing composition has a pH of about 1 to about 7. In some embodiments, the polishing composition has a pH of about 6 or less, e.g., about 5.5 or less, about 5 or less, about 4.5 or less, or about 4 or less. Alternatively, or in addition, the polishing composition can have a pH of about 1 or more, e.g., about 2 or more, or about 3 or more. Thus, the polishing composition can have a pH bounded by any two of the aforementioned endpoints. For example, the polishing composition can have a pH of about 1 to about 6, e.g., about 1 to about 5.5, about 1 to about 5, about 1 to about 4.5, about 1 to about 4, about 2 to about 6, about 2 to about 5.5, about 2 to about 5, about 2 to about 4.5, about 2 to about 4, about 3 to about 6, about 3 to about 5.5, about 3 to about 5, about 3 to about 4.5, or about 3 to about 4. In some embodiments, the chemical-mechanical polishing composition has a pH of about 1 to about 5. In certain embodiments, the polishing composition has a pH of about 3 to about 5.

The pH of the polishing composition can be adjusted using any suitable acid or base. Non-limiting examples of suitable acids include nitric acid, sulfuric acid, phosphoric acid, and organic acids such as formic acid and acetic acid. Non-limiting examples of suitable bases include sodium hydroxide, potassium hydroxide, and ammonium hydroxide.

In some embodiments, the polishing composition further comprises a buffering agent. The buffering agent can be any suitable compound capable of buffering (e.g., maintaining) the polishing composition at a particular pH range. For example, the buffering agent can be selected from an ammonium salt, an alkali metal salt, an alkali metal hydroxide, an alkali metal carbonate, an alkali metal bicarbonate, a borate, an amino acid, and combinations thereof.

In some embodiments, the polishing composition further comprises an inorganic salt. The inorganic salt can be any suitable inorganic salt that is water-soluble. For example, the inorganic salt can be one or more inorganic salts selected from water-soluble bromides, chlorides, iodides, acetates, nitrates, sulfates, and combinations thereof. Without wishing to be bound by any particular theory, it is believed that the inorganic salt can be used to enhance the rate of polishing the substrate (e.g., silicon carbide). In some embodiments, the inorganic salt is an aluminum-based inorganic salt. For example, the inorganic salt can be aluminum sulfate, aluminum nitrate (e.g., aluminum nitrate hexahydrate), aluminum acetate, aluminum bromide, aluminum chloride, aluminum iodide, or a combination thereof. In some embodiments, the polishing composition further comprises aluminum nitrate (e.g., aluminum nitrate hexahydrate).

The chemical-mechanical polishing composition optionally further comprises one or more additives. Illustrative additives include conditioners, acids (e.g., sulfonic acids), complexing agents, chelating agents, biocides, scale inhibitors, and dispersants.

In some embodiments, the polishing composition further comprises a biocide. A non-limiting example of a suitable biocide is an isothiazolinone based biocide such as Kordek MLX™ (DuPont, Wilmington, DE). The polishing composition can comprise any suitable amount of the biocide. For example, the polishing composition can comprise about 0.001 wt. % to about 0.2 wt. % of the biocide.

In embodiments, the invention provides a chemical-mechanical polishing composition comprising, consisting essentially of, or consisting of: (a) an abrasive particle; (b) an ionic oxidizer; and (c) water, wherein the chemical-mechanical polishing composition has a pH of about 1 to about 5, the abrasive particle has an isoelectric point that is higher than 8, and the ionic oxidizer is oxone, cerium ammonium nitrate, a periodate, an iodate, a persulfate, a chlorate, a chromate, a permanganate, a bromate, a perbromate, a ferrate, a perrhenate, a perruthenate, or a combination thereof.

In embodiments, the invention provides a chemical-mechanical polishing composition comprising, consisting essentially of, or consisting of: (a) an abrasive particle; (b) an ionic oxidizer; and (c) water, wherein the chemical-mechanical polishing composition has a pH of about 3 to about 5, the abrasive particle has an isoelectric point that is higher than 8, and the ionic oxidizer is potassium persulfate, potassium permanganate, periodic acid, or a combination thereof.

In embodiments, the invention provides a chemical-mechanical polishing composition comprising, consisting essentially of, or consisting of: (a) a silica abrasive particle; (b) an ionic oxidizer; and (c) water, wherein the chemical-mechanical polishing composition has a pH of about 3 to about 5, the abrasive particle has an isoelectric point that is higher than 8, and the ionic oxidizer is potassium persulfate, potassium permanganate, periodic acid, or a combination thereof.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., abrasive particle, ionic oxidizer, optional pH adjustor, optional inorganic salt, and/or any optional additive) as well as any combination of ingredients (e.g., abrasive particle, ionic oxidizer, optional pH adjustor, optional inorganic salt, and/or any optional additive, etc.).

For example, the polishing composition can be prepared by (i) providing all or a portion of the liquid carrier, (ii) dispersing the abrasive particle, ionic oxidizer, optional pH adjustor, optional inorganic salt, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., ionic oxidizer, optional pH adjustor, optional inorganic salt, and/or any optional additive) in an abrasive slurry (e.g., a silica abrasive slurry), (ii) providing one or more components in an additive solution (e.g., liquid carrier, ionic oxidizer, optional pH adjustor, optional inorganic salt, and/or any optional additive), (iii) combining the abrasive slurry (e.g., the silica abrasive slurry) and the additive solution to form a mixture, (iv) optionally adding suitable amounts of any other optional additives to the mixture, and (v) adjusting the pH of the mixture as appropriate.

The polishing composition can be supplied as a one-package system comprising an abrasive particle (e.g., a silica abrasive particle), ionic oxidizer, optional pH adjustor, optional inorganic salt, and/or any optional additive, and water. Alternatively, the polishing composition of the invention can be supplied as a two-package system comprising an abrasive slurry (e.g., a silica abrasive slurry) in a first package and an additive solution in a second package, wherein the abrasive slurry (e.g., the silica abrasive slurry) consists essentially of, or consists of, an abrasive (e.g., a silica abrasive), and water, and wherein the additive solution consists essentially of, or consists of, ionic oxidizer, optional pH adjustor, optional inorganic salt, and/or any optional additive. The two-package system allows for the adjustment of polishing composition characteristics by changing the blending ratio of the two packages, i.e., the abrasive slurry (e.g., the silica abrasive slurry) and the additive solution.

Various methods can be employed to utilize such a two-package polishing system. For example, the abrasive slurry (e.g., the silica abrasive slurry) and additive solution can be delivered to the polishing table by different pipes that are joined and connected at the outlet of supply piping. The abrasive slurry (e.g., the silica abrasive slurry) and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined “immediately before delivery to the point-of-use” if the components are combined about 5 minutes or less prior to being added in mixed form onto the platen, for example, about 4 minutes or less, about 3 minutes or less, about 2 minutes or less, about 1 minute or less, about 45 seconds or less, about 30 seconds or less, about 10 seconds or less prior to being added in mixed form onto the platen, or simultaneously to the delivery of the components at the point-of-use (e.g., the components are combined at a dispenser). Components also are combined “immediately before delivery to the point-of-use” if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the abrasive particle (e.g., the silica abrasive particle), ionic oxidizer, optional pH adjustor, optional inorganic salt, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the abrasive particle (e.g., the silica abrasive particle), ionic oxidizer, optional pH adjustor, optional inorganic salt, and/or any optional additive are at least partially or fully dissolved in the concentrate.

The invention further provides a method of chemically-mechanically polishing a substrate comprising: (i) providing a substrate, (ii) providing a polishing pad, (iii) providing a chemical-mechanical polishing composition comprising: (a) an abrasive particle; (b) an ionic oxidizer; and (c) water, the chemical-mechanical polishing composition has a pH of about 1 to about 7, the abrasive particle has an isoelectric point that is higher than 8, and the ionic oxidizer has a negative charge at the pH of the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

The chemical-mechanical polishing composition can be used to polish any suitable substrate and is especially useful for polishing substrates comprising at least one layer (typically a surface layer) comprising silicon carbide. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon carbide, silicon nitride, and/or silicon oxide, e.g., any one, two, or especially all three of the aforementioned materials. In a preferred embodiment, the substrate comprises a silicon carbide layer on a surface of the substrate, wherein at least a portion of the silicon carbide layer on the surface of the substrate is abraded to polish the substrate.

In certain embodiments, the substrate comprises silicon carbide in combination with silicon nitride and/or silicon oxide. In other words, in certain embodiments, the substrate further comprises a silicon nitride layer on a surface of the substrate, wherein at least a portion of the silicon nitride layer on the surface of the substrate is abraded to polish the substrate. Alternatively, or in addition, the substrate further comprises a silicon oxide layer on a surface of the substrate, wherein at least a portion of the silicon oxide layer on a surface of the substrate is abraded to polish the substrate.

The silicon carbide can be any suitable silicon carbide, many forms of which are known in the art. The silicon carbide can have any suitable polytype. The silicon nitride can be any suitable silicon nitride. The silicon oxide similarly can be any suitable silicon oxide, many forms of which are known in the art. Suitable types of silicon oxide include, but are not limited to, tetraethyl orthosilicate (TEOS), borophosphosilicate glass (BPSG), plasma enhanced tetraethylorthosilicate (PETEOS), thermal oxide, undoped silicate glass, and high density plasma (HDP) oxide.

The polishing composition of the invention desirably exhibits a high removal rate when polishing a substrate comprising silicon carbide according to a method of the invention. For example, when polishing silicon wafers comprising a silicon carbide layer in accordance with an embodiment of the invention, the polishing composition desirably exhibits a removal rate of the silicon carbide of about 300 Å/min or higher, e.g., about 350 Å/min or higher, about 400 Å/min or higher, about 450 Å/min or higher, about 500 Å/min or higher, 550 Å/min or higher, about 600 Å/min or higher, about 650 Å/min or higher, about 700 Å/min or higher, about 750 Å/min or higher, about 800 Å/min or higher, about 850 Å/min or higher, about 900 Å/min or higher, about 950 Å/min or higher, about 1000 Å/min or higher, about 1100 Å/min or higher, about 1200 Å/min or higher, about 1300 Å/min or higher, about 1400 Å/min or higher, about 1500 Å/min or higher, about 1600 Å/min or higher, about 1700 Å/min or higher, about 1800 Å/min or higher, about 1900 Å/min or higher, about 2000 Å/min or higher, about 2100 Å/min or higher, about 2200 Å/min or higher, about 2300 Å/min or higher, about 2400 Å/min or higher, about 2500 Å/min or higher, about 2600 Å/min or higher, about 2700 Å/min or higher, about 2800 Å/min or higher, about 2900 Å/min or higher, or about 3000 Å/min or higher. In some embodiments, when polishing silicon wafers comprising a silicon carbide layer in accordance with an embodiment of the invention, the polishing composition desirably exhibits a removal rate of the silicon carbide of about 500 Å/min or higher.

In embodiments, where the substrate further comprises silicon oxide, the silicon oxide can be any suitable silicon oxide, many of which are known in the art. Suitable types of silicon oxide include but are not limited to borophosphosilicate glass (BPSG), tetraethyl orthosilicate (TEOS), plasma enhanced tetraethylorthosilicate (PETEOS), thermal oxide, undoped silicate glass, and high density plasma (HDP) oxide. The chemical-mechanical polishing composition of the invention desirably exhibits a low removal rate when polishing a substrate comprising silicon oxide according to a method of the invention. For example, when polishing substrates comprising silicon oxide in accordance with an embodiment of the invention, the polishing composition desirably exhibits a removal rate of silicon oxide of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, when polishing substrates comprising silicon oxide (e.g., on a surface of the substrate) in accordance with an embodiment of the invention, the polishing composition desirably exhibits a removal rate of silicon oxide of about 50 Å/min or lower. In certain embodiments, the polishing composition exhibits a silicon oxide removal rate that is too low to be detected. In certain embodiments, the polishing composition does not remove any silicon oxide (i.e., a removal rate of 0 Å/min). Thus, when used to polish a substrate comprising a silicon carbide layer and a silicon oxide layer (e.g., on a surface of the substrate), the polishing composition desirably exhibits selectivity for the polishing of the silicon carbide layer over the silicon oxide layer.

In embodiments, where the substrate further comprises silicon nitride, the silicon nitride can be any suitable silicon nitride, many of which are known in the art. The chemical-mechanical polishing composition of the invention desirably exhibits a low removal rate when polishing a substrate comprising silicon nitride (e.g., on a surface of the substrate) according to a method of the invention. For example, when polishing substrates comprising silicon nitride in accordance with an embodiment of the invention, the polishing composition desirably exhibits a removal rate of silicon nitride of about 500 Å/min or lower, for example, about 250 Å/min or lower, about 200 Å/min or lower, about 150 Å/min or lower, about 100 Å/min or lower, about 50 Å/min or lower, about 25 Å/min or lower, about 10 Å/min or lower, or about 5 Å/min or lower. In some embodiments, when polishing substrates comprising silicon nitride (e.g., on a surface of the substrate) in accordance with an embodiment of the invention, the polishing composition desirably exhibits a removal rate of silicon nitride of about 50 Å/min or lower. In certain embodiments, the polishing composition exhibits a silicon nitride removal rate that is too low to be detected. In certain embodiments, the polishing composition does not remove any silicon nitride (i.e., a removal rate of 0 Å/min). Thus, when used to polish a substrate comprising a silicon carbide layer and a silicon nitride layer, the polishing composition desirably exhibits selectivity for the polishing of the silicon carbide layer over the silicon nitride layer.

The chemical-mechanical polishing composition of the invention can be tailored to provide effective polishing at the desired polishing ranges selective to specific thin layer materials, while at the same time minimizing surface imperfections, defects, corrosion, erosion, and the removal of stop layers. The selectivity can be controlled, to some extent, by altering the relative concentrations of the components of the polishing composition. When desirable, the chemical-mechanical polishing composition of the invention can be used to polish a substrate comprising silicon carbide and silicon nitride on a layer of the surface of the substrate, wherein the chemical-mechanical polishing composition provides a silicon carbide to silicon nitride polishing selectivity of about 5:1 or higher (e.g., about 10:1 or higher, about 15:1 or higher, about 25:1 or higher, about 50:1 or higher, about 100:1 or higher, or about 150:1 or higher). Also, the chemical-mechanical polishing composition of the invention can be used to polish a substrate comprising silicon carbide and silicon oxide on a layer of the surface of the substrate, wherein the chemical-mechanical polishing composition provides a silicon carbide to silicon oxide polishing selectivity of about 5:1 or higher (e.g., about 10:1 or higher, about 15:1 or higher, about 25:1 or higher, about 50:1 or higher, about 100:1 or higher, or about 150:1 or higher). Thus, in embodiments, when used to polish substrates comprising at least one layer of silicon carbide and at least one layer of silicon nitride and/or at least one layer of silicon oxide, the polishing composition and polishing method allow for the preferential removal of silicon carbide as compared with the removal of silicon nitride and/or silicon oxide. As used herein, the phrase "polishing selectivity" refers to the ratio of the removal rates of two different thin layer materials.

The polishing composition of the invention desirably exhibits low particle defects when polishing a substrate, as determined by suitable techniques. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SPI instruments operating at a 120 nm threshold or at 160 nm threshold).

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, EPIC™ D100 pad (commercially available from CMC Materials), IC1010 pad (commercially available from Dow, Inc.) and Fujibo POLYPAS™ 27.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511. U.S. Pat. Nos. 5,643,046, 5,658,183, 5,730,642, 5,838,447, 5,872,633. U.S. Pat. Nos. 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

In embodiments, the invention provides a method of chemically-mechanically polishing a substrate comprising: (i) providing a substrate, (ii) providing a polishing pad, (iii) providing a chemical-mechanical polishing composition comprising, consisting essentially of, or consisting of: (a) an abrasive particle; (b) an ionic oxidizer; and (c) water, wherein the chemical-mechanical polishing composition has a pH of about 1 to about 5, the abrasive particle has an isoelectric point that is higher than 8, and the ionic oxidizer is oxone, cerium ammonium nitrate, a periodate, an iodate, a persulfate, a chlorate, a chromate, a permanganate, a bromate, a perbromate, a ferrate, a perrhenate, a perruthenate, or a combination thereof, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

In embodiments, the invention provides a method of chemically-mechanically polishing a substrate comprising: (i) providing a substrate, (ii) providing a polishing pad, (iii) providing a chemical-mechanical polishing composition comprising, consisting essentially of, or consisting of: (a) an abrasive particle; (b) an ionic oxidizer; and (c) water, wherein the chemical-mechanical polishing composition has a pH of about 3 to about 5, the abrasive particle has an isoelectric point that is higher than 8, and the ionic oxidizer is potassium persulfate, potassium permanganate, periodic acid, or a combination thereof, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

In embodiments, the invention provides a method of chemically-mechanically polishing a substrate comprising: (i) providing a substrate, (ii) providing a polishing pad, (iii) providing a chemical-mechanical polishing composition comprising, consisting essentially of, or consisting of: (a) a silica abrasive particle; (b) an ionic oxidizer; and (c) water, wherein the chemical-mechanical polishing composition has a pH of about 3 to about 5, the abrasive particle has an isoelectric point that is higher than 8, and the ionic oxidizer is potassium persulfate, potassium permanganate, periodic acid, or a combination thereof, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

Aspects, including embodiments, of the invention described herein may be beneficial alone or in combination, with one or more other aspects or embodiments. Without limiting the foregoing description, certain non-limiting embodiments of the disclosure numbered 1-37 are provided below. As will be apparent to those of skill in the art upon reading this disclosure, each of the individually numbered embodiments may be used or combined with any of the preceding or following individually numbered embodiments. This is intended to provide support for all such combinations of embodiments and is not limited to combinations of embodiments explicitly provided below:

EMBODIMENTS (1) In embodiment (1) is presented a chemical-mechanical polishing composition comprising:

(a) an abrasive particle;

(b) an ionic oxidizer; and (c) water, wherein the chemical-mechanical polishing composition has a pH of about 1 to about 7, the abrasive particle has an isoelectric point that is higher than 8, and the ionic oxidizer has a negative charge at the pH of the chemical-mechanical polishing composition.

(2) In embodiment (2) is presented the polishing composition of embodiment (1), wherein the polishing composition has a pH of about 1 to about 5.

(3) In embodiment (3) is presented the polishing composition of embodiment (1) or embodiment (2), wherein the polishing composition has a pH of about 3 to about 5.

(4) In embodiment (4) is presented the polishing composition of any one of embodiments (1)-(3), wherein the polishing composition comprises about 0.001 wt. % to about 10 wt. % of the abrasive particle.

(5) In embodiment (5) is presented the polishing composition of any one of embodiments (1)-(4), wherein the polishing composition comprises about 0.05 wt. % to about 5 wt. % of the abrasive particle.

(6) In embodiment (6) is presented the polishing composition of any one of embodiments (1)-(5), wherein the abrasive particle has a Mohs hardness of about 7 or less.

(7) In embodiment (7) is presented the polishing composition of any one of embodiments (1)-(6), wherein the abrasive particle has a Mohs hardness of about 6 or less.

(8) In embodiment (8) is presented the polishing composition of any one of embodiments (1)-(7), wherein the abrasive particle has an isoelectric point of about 8.2 to about 11.

(9) In embodiment (9) is presented the polishing composition of any one of embodiments (1)-(8), wherein the abrasive particle has an isoelectric point of about 8.5 to about 10.

(10) In embodiment (10) is presented the polishing composition of any one of embodiments (1)-(9), wherein the abrasive particle has an isoelectric point of about 8.8 to about 9.5.

(11) In embodiment (11) is presented the polishing composition of any one of embodiments (1)-(10), wherein the abrasive particle comprises silica, zirconia, ceria, or a combination thereof.

(12) In embodiment (12) is presented the polishing composition of any one of embodiments (1)-(11), wherein the abrasive particle comprises silica.

(13) In embodiment (13) is presented the polishing composition of any one of embodiments (1)-(12), wherein the abrasive particle comprises surface-modified colloidal silica.

(14) In embodiment (14) is presented the polishing composition of any one of embodiments (1)-(13), wherein the ionic oxidizer is oxone, cerium ammonium nitrate, a periodate, an iodate, a persulfate, a chlorate, a chromate, a permanganate, a bromate, a perbromate, a ferrate, a perrhenate, a perruthenate, or a combination thereof.

(15) In embodiment (15) is presented the polishing composition of any one of embodiments (1)-(14), wherein the ionic oxidizer is a periodate, a persulfate, a permanganate, or a combination thereof.

(16) In embodiment (16) is presented the polishing composition of any one of embodiments (1)-(15), wherein the ionic oxidizer is potassium persulfate, potassium permanganate, periodic acid, or a combination thereof.

(17) In embodiment (17) is presented the polishing composition of any one of embodiments (1)-(16), wherein the polishing composition further comprises a buffering agent.

(18) In embodiment (18) is presented the polishing composition of any one of embodiments (1)-(17), wherein the polishing composition further comprises an inorganic salt.

(19) In embodiment (19) is presented the polishing composition of embodiments (18), wherein the inorganic salt is an aluminum-based inorganic salt.

(20) In embodiment (20) is presented a method of chemically-mechanically polishing a substrate comprising:

(i) providing a substrate, (ii) providing a polishing pad, (iii) providing a chemical-mechanical polishing composition comprising:

(a) an abrasive particle;

(b) an ionic oxidizer; and (c) water, the chemical-mechanical polishing composition has a pH of about 1 to about 7, the abrasive particle has an isoelectric point that is higher than 8, and the ionic oxidizer has a negative charge at the pH of the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

(21) In embodiment (21) is presented the method of embodiment (20), wherein the polishing composition has a pH of about 1 to about 5.

(22) In embodiment (22) is presented the method of embodiment (20) or embodiment (21), wherein the polishing composition has a pH of about 3 to about 5.

(23) In embodiment (23) is presented the method of any one of embodiments (20)-(22), wherein the polishing composition comprises about 0.001 wt. % to about 10 wt. % of the abrasive particle.

(24) In embodiment (24) is presented the method of any one of embodiments (20)-(23), wherein the polishing composition comprises about 0.05 wt. % to about 5 wt. % of the abrasive particle.

(25) In embodiment (25) is presented the method of any one of embodiments (20)-(24), wherein the abrasive particle has a Mohs hardness of about 7 or less.

(26) In embodiment (26) is presented the method of any one of embodiments (20)-(25), wherein the abrasive particle has a Mohs hardness of about 6 or less.

(27) In embodiment (27) is presented the method of any one of embodiments (20)-(26), wherein the abrasive particle has an isoelectric point of about 8.2 to about 11.

(28) In embodiment (28) is presented the method of any one of embodiments (20)-(27), wherein the abrasive particle has an isoelectric point of about 8.5 to about 10.

(29) In embodiment (29) is presented the method of any one of embodiments (20)-(28), wherein the abrasive particle has an isoelectric point of about 8.8 to about 9.5.

(30) In embodiment (30) is presented the method of any one of embodiments (20)-(29), wherein the abrasive particle comprises silica, zirconia, ceria, or a combination thereof.

(31) In embodiment (31) is presented the method of any one of embodiments (20)-(30), wherein the abrasive particle comprises silica.

(32) In embodiment (32) is presented the method of any one of embodiments (20)-(31), wherein the abrasive particle comprises surface-modified colloidal silica.

(33) In embodiment (33) is presented the method of any one of embodiments (20)-(32), wherein the ionic oxidizer is oxone, cerium ammonium nitrate, a periodate, an iodate, a persulfate, a chlorate, a chromate, a permanganate, a bromate, a perbromate, a ferrate, a perrhenate, a perruthenate, or a combination thereof.

(34) In embodiment (34) is presented the method of any one of embodiments (20)-(33), wherein the ionic oxidizer is a periodate, a persulfate, a permanganate, or a combination thereof.

(35) In embodiment (35) is presented the method of any one of embodiments (20)-(34), wherein the ionic oxidizer is potassium persulfate, potassium permanganate, periodic acid, or a combination thereof.

(36) In embodiment (36) is presented the method of any one of embodiments (20)-(35), wherein the polishing composition further comprises a buffering agent.

(37) In embodiment (37) is presented the method of any one of embodiments (20)-(36), wherein the polishing composition further comprises an inorganic salt.

(38) In embodiment (38) is presented the method of embodiments (37), wherein the inorganic salt is an aluminum-based inorganic salt.

(39) In embodiment (39) is presented the method of any one of embodiments (20)-(38), wherein the substrate comprises a silicon carbide layer on a surface of the substrate, and wherein at least a portion of the silicon carbide layer on the surface of the substrate is abraded to polish the substrate.

(40) In embodiment (40) is presented the method of embodiment (39), wherein the substrate further comprises a silicon nitride layer on a surface of the substrate, and wherein at least a portion of the silicon nitride layer on the surface of the substrate is abraded to polish the substrate.

(41) In embodiment (41) is presented the method of embodiment (39) or embodiment (40), wherein the substrate further comprises a silicon oxide layer on a surface of the substrate, and wherein at least a portion of the silicon oxide layer on a surface of the substrate is abraded to polish the substrate.

EXAMPLES

These following examples further illustrate the invention but, of course, should not be construed as in any way limiting its scope.

The following abbreviations are used throughout the Examples: removal rate (RR); silicon carbide (SiC); root mean square (RMS); roughness average (RA); isoelectric point (IEP); zeta potential (ZP); and molecular weight (MW).

In the following examples, SiC was coated on silicon, and the resulting patterned substrates were polished using a SPEEDFAM™ 32B benchtop polishing machine (50 rpm, 60 min polishing time, and a flow rate of 125 mL/min) and a Suba pad conditioned with a product commercially identified as A82 (3M, St. Paul, MN). Removal rates were calculated by measuring the film thickness, using spectroscopic elipsometry, and subtracting the final thickness from the initial thickness.

Example 1

This example demonstrates the silicon carbide removal rates of alumina, silica, zirconia, and ceria abrasives at varying pH values above and below their isoelectric points, when used in combination with combination with an ionic oxidizer such as potassium permanganate ($KMnO_4$).

Aqueous polishing compositions were prepared containing 0.4 wt. % potassium permanganate ($KMnO_4$), 0.15 wt. % of aluminum nitrate hexahydrate, and 0.6 wt. % of one of alumina (i.e., alpha alumina with a dynamic light scattering particle size of 120 nm), silica (i.e., surface-modified colloidal silica having a thin layer alumina coating and a dynamic light scattering particle size of 110 nm), zirconia (i.e., zirconia particles with a dynamic light scattering particle size of 180 nm), or ceria (i.e., ceria particles with a dynamic light scattering particle size of 110 nm). The pH of each polishing composition was adjusted to 2, 3.8, 6, or 10.3 using nitric acid as an acid and potassium hydroxide as a base, as appropriate.

The aqueous polishing compositions comprising alumina particles, silica particles, and zirconia particles at pH values of 2, 3.8, 6, and/or 10.3 were used to polish silicon carbide (SiC) using a MAT AWR-681MS polishing machine and a POWER1000 polishing pad at a downforce of 5.4 psi, and the removal rate (μm/hr) results are set forth in FIG. 1. Similarly, the aqueous polishing compositions comprising alumina particles and ceria particles at pH values of 2, 3.8, and/or 6 were used to polish silicon carbide (SiC) using a MAT AWR-681MS polishing machine and a POWER1000 polishing pad at a downforce of 11 psi, and the removal rate (μm/hr) results are set forth in FIG. 2.

Figure 2:
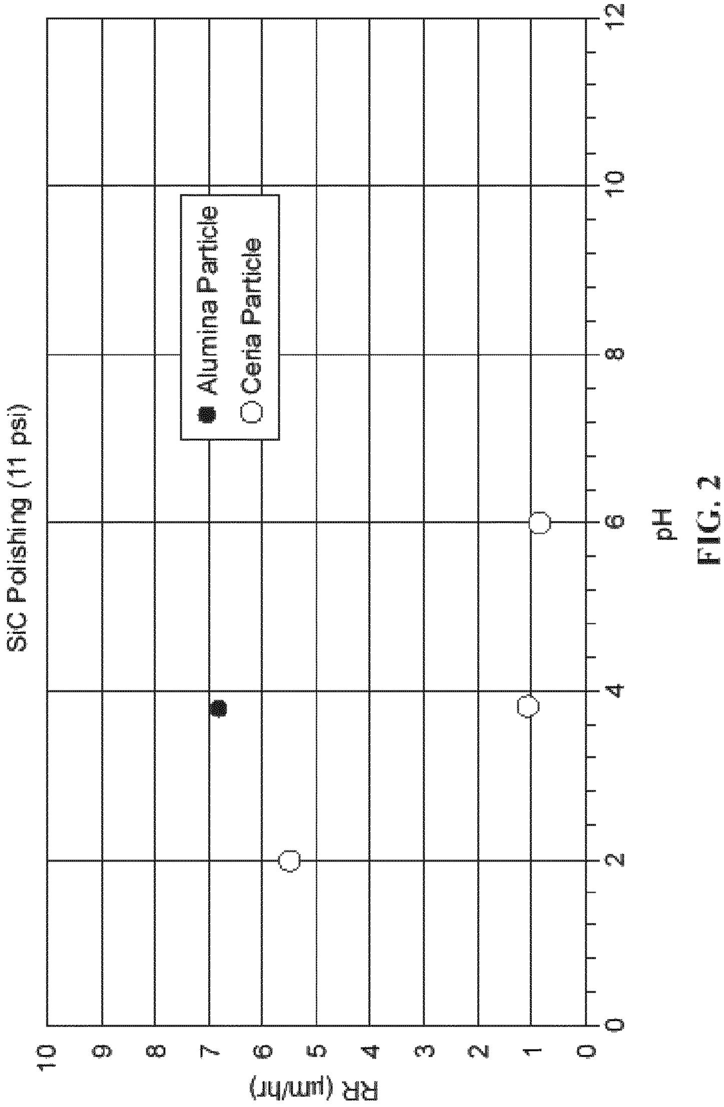
FIG. 2 shows the silicon carbide (SiC) removal rate (μm/hr) at 11 psi for an aluminum particle and ceria particle, as described in Example 1.

As is apparent from the results set forth in FIGS. 1 and 2, aqueous polishing compositions comprising alumina, silica, zirconia, and ceria all exhibited desirable silicon carbide removal rates at lower pH values, and preferably pH values below their IEP, when used in combination with potassium permanganate ($KMnO_4$).

Example 2

This example demonstrates the isoelectric point of surface-modified colloidal silica having a thin layer alumina coating and a dynamic light scattering particle size of 110 nm.

Silica Particle A was added to an aqueous solution and the pH was slowly adjusted from 2 to 10.5 using nitric acid as an acid and potassium hydroxide as a base, as appropriate. The zeta potential (ZP) of Silica Particle A was measured at varying pH values using a Model DT-1202 Acoustic and Electro-acoustic spectrometer available from Dispersion Technologies, Inc. (Bedford Hills, N.Y.), and the results are set forth in FIG. 3.

Figure 3:
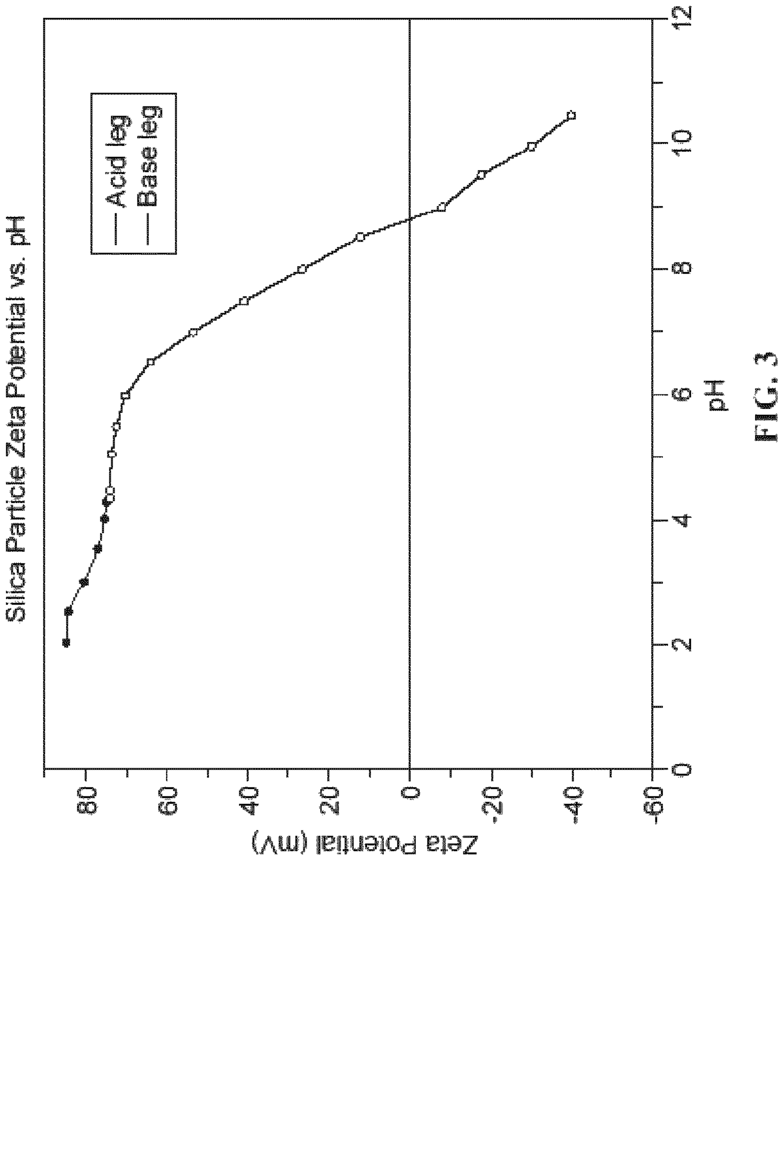
FIG. 3 shows the zeta potential (mV) as a function of pH for Silica Particle A, as described in Example 2, and as used in Example 3.

As is apparent from the results set forth in FIG. 3, Silica Particle A had an IEP of approximately 9 and a zeta potential greater than approximately 20 mV at all pH values less than 8.

Example 3

This example demonstrates the silicon carbide removal rates provided by polishing compositions comprising an abrasive particle and an ionic oxidizer, wherein the abrasive particle has an isoelectric point that is higher than 8.

Aqueous polishing slurries were prepared containing 0.4 wt. % potassium permanganate ($KMnO_4$), 0.15 wt. % of aluminum nitrate hexahydrate, and 0.6 wt. % of silica or alumina particles, as described below:

- Polishing Composition 3A (Inventive)—Silica Particle A (from Example 2), which is a surface-modified colloidal silica having a thin layer alumina coating, a positive native zeta potential, and a dynamic light scattering particle size of 110 nm.
- Polishing Composition 3B (Comparative)—alpha alumina with a positive native zeta potential and a dynamic light scattering particle size of 120 nm.
- Polishing Composition 3C (Comparative)—surface-modified colloidal silica, which has been aluminum doped, having a negative native zeta potential and a dynamic light scattering particle size of 45 nm.
- Polishing Composition 3D (Comparative)—colloidal silica having a negative native zeta potential and a dynamic light scattering particle size of 53 nm.
- Polishing Composition 3E (Comparative)—surface-modified colloidal silica, which has been aluminum doped, having a negative native zeta potential and a dynamic light scattering particle size of 160 nm.
- Polishing Composition 3F (Comparative)—transition alumina particle with a positive native zeta potential and a dynamic light scattering particle size of 55 nm.
- Polishing Composition 3G (Comparative)—fumed silica particle with negative native zeta potential and a dynamic light scattering particle size of 120 nm.

The pH of Polishing Compositions 3A-3G was adjusted to 3.8 and each of the polishing compositions were used to polish silicon carbide (SiC) using a MAT AWR-681MS polishing machine and a POWER1000 polishing pad at a downforce of 9 psi. The removal rate (μm/hr) results are set forth in Table 1 and plotted in FIG. 4.

TABLE 1

| SiC Polishing Removal Rate of Silica and Alumina Particles at pH 3.8 | | |
|---|---|---|
| Polishing Composition | Ionic Oxidizer (wt. %) | Removal Rate (μm/hr) |
| 3A (Inventive) | $KMnO_4$ (0.4 wt. %) | 3.06 |
| 3B (Comparative) | $KMnO_4$ (0.4 wt. %) | 3.22 |
| 3C (Comparative) | $KMnO_4$ (0.4 wt. %) | 2.39 |
| 3D (Comparative) | $KMnO_4$ (0.4 wt. %) | 2.51 |
| 3E (Comparative) | $KMnO_4$ (0.4 wt. %) | 1.82 |
| 3F (Comparative) | $KMnO_4$ (0.4 wt. %) | 3.01 |
| 3G (Comparative) | $KMnO_4$ (0.4 wt. %) | 2.66 |

Figure 4:
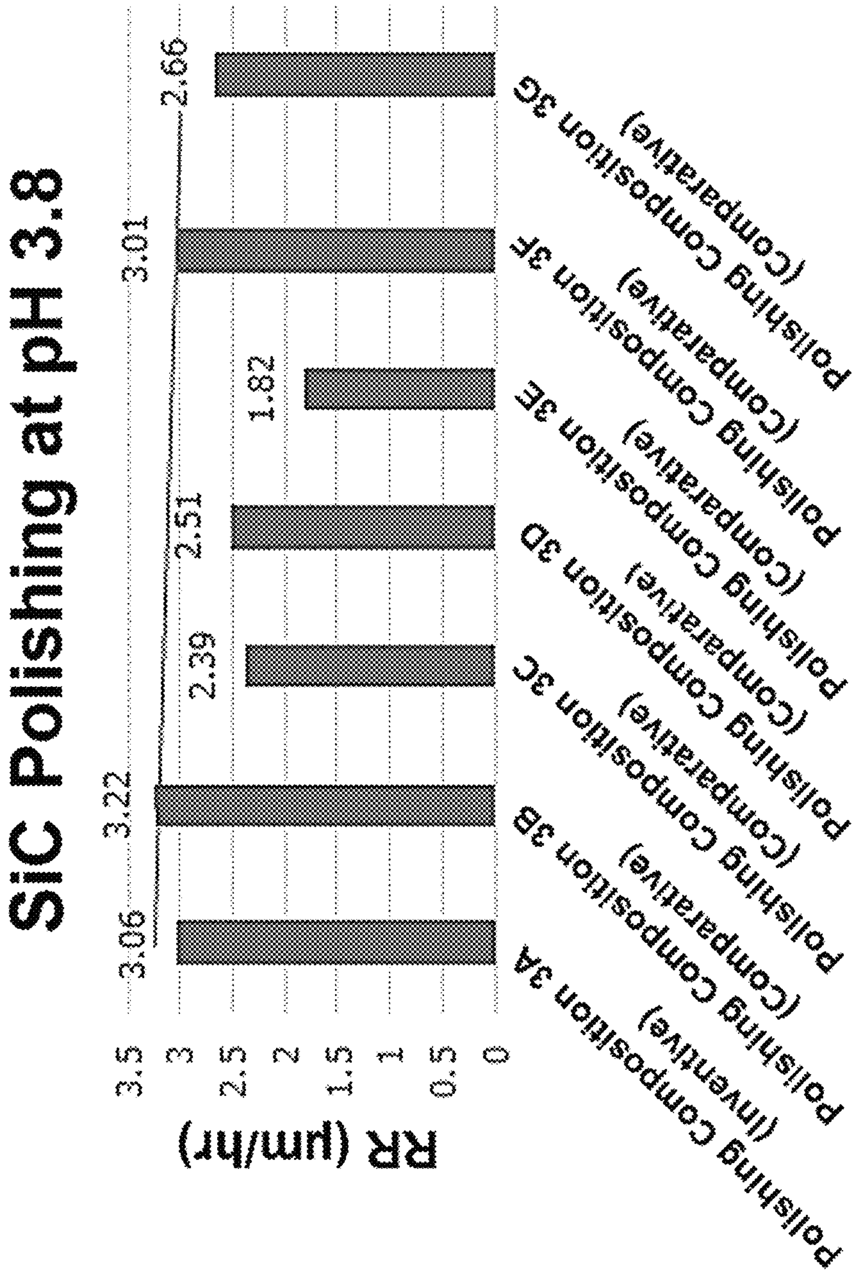
FIG. 4 shows the silicon carbide (SiC) removal rate (μm/hr) at pH 3.8 for Polishing Compositions 3A-3G, as described in Example 3.

As is apparent from the results set forth in Table 1 and FIG. 4, inventive Polishing Composition 3A, comprising Silica Particle A (from Example 2), exhibited a silicon carbide removal rate that is comparable to the highest silicon carbide removal rate, exhibited by comparative Polishing Composition 3B, comprising alpha alumina with a positive native zeta potential and a dynamic light scattering particle size of 120 nm. In addition, inventive Polishing Composition 3A, comprising Silica Particle A (from Example 2), exhibited a higher silicon carbide removal rate than all other polishing compositions tested (i.e., comparative Polishing Compositions 3C-3G).

Example 4

This example demonstrates the silicon carbide removal rates and surface defects provided by polishing compositions comprising an abrasive particle and an ionic oxidizer, wherein the abrasive particle has an isoelectric point that is higher than 8.

Aqueous polishing slurries were prepared containing 0.4 wt. % potassium permanganate ($KMnO_4$), 0.15 wt. % of aluminum nitrate hexahydrate, and 0.6 wt. % of silica or alumina particles, as described below:

- Polishing Composition 4A (Inventive)—a surface-modified colloidal silica having a thin layer alumina coating, a positive native zeta potential, and a dynamic light scattering particle size of 32 nm.
- Polishing Composition 4B (Comparative)—alpha alumina with a positive native zeta potential and a dynamic light scattering particle size of 120 nm.

The pH of Polishing Compositions 4A and 4B was adjusted to 3.8 and each of the polishing compositions was used to polish silicon carbide (SiC) using a SPEEDFAM™ 32B polishing machine and a SUBA™ polishing pad at a downforce of 5.63 psi. The removal rate (μm/hr) results are set forth in Table 2 and plotted in FIG. 5, the roughness average (nm) results are set forth in Table 2 and plotted in FIG. 6, and the scratch prevalence (number of scratches) results are set forth in Table 2 and plotted in FIG. 7.

TABLE 2

| SiC Polishing Properties of Silica and Alumina Particles | | | | |
|---|---|---|---|---|
| Polishing Composition | Oxidant (wt. %) | Removal Rate (μm/hr) | Roughness RA (nm) | Avg. # of Scratches |
| 4A (Inventive) | $KMnO_4$ (0.4 wt. %) | 1.68 | 0.85 | ~40 |
| 4B (Comparative) | $KMnO_4$ (0.4 wt. %) | 1.76 | 0.80 | ~100 |

Figure 5:
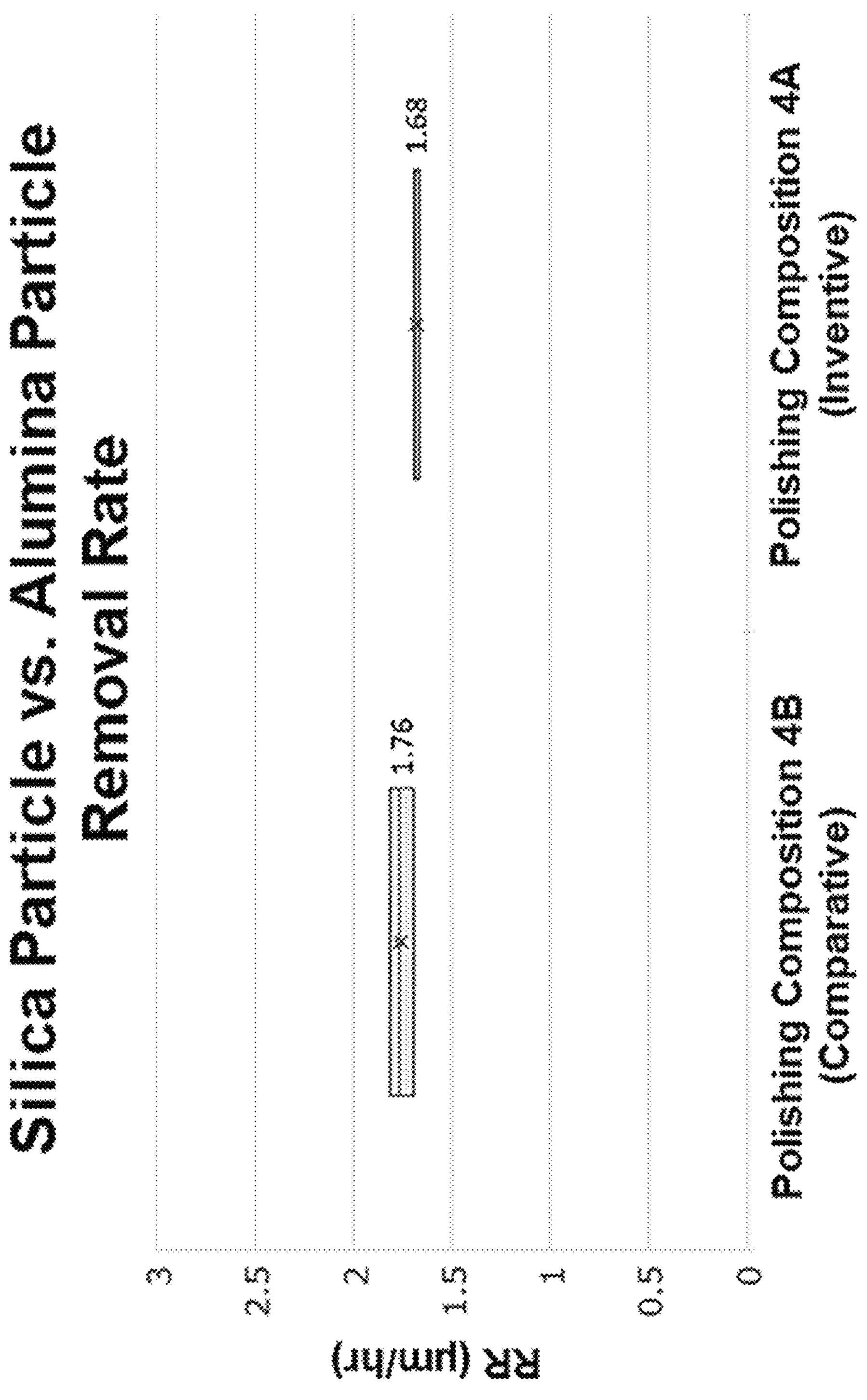
FIG. 5 shows the silicon carbide (SiC) removal rate (μm/hr) for Polishing Composition 4A (Inventive) and Polishing Composition 4B (Comparative), as described in Example 4.
Figure 6:
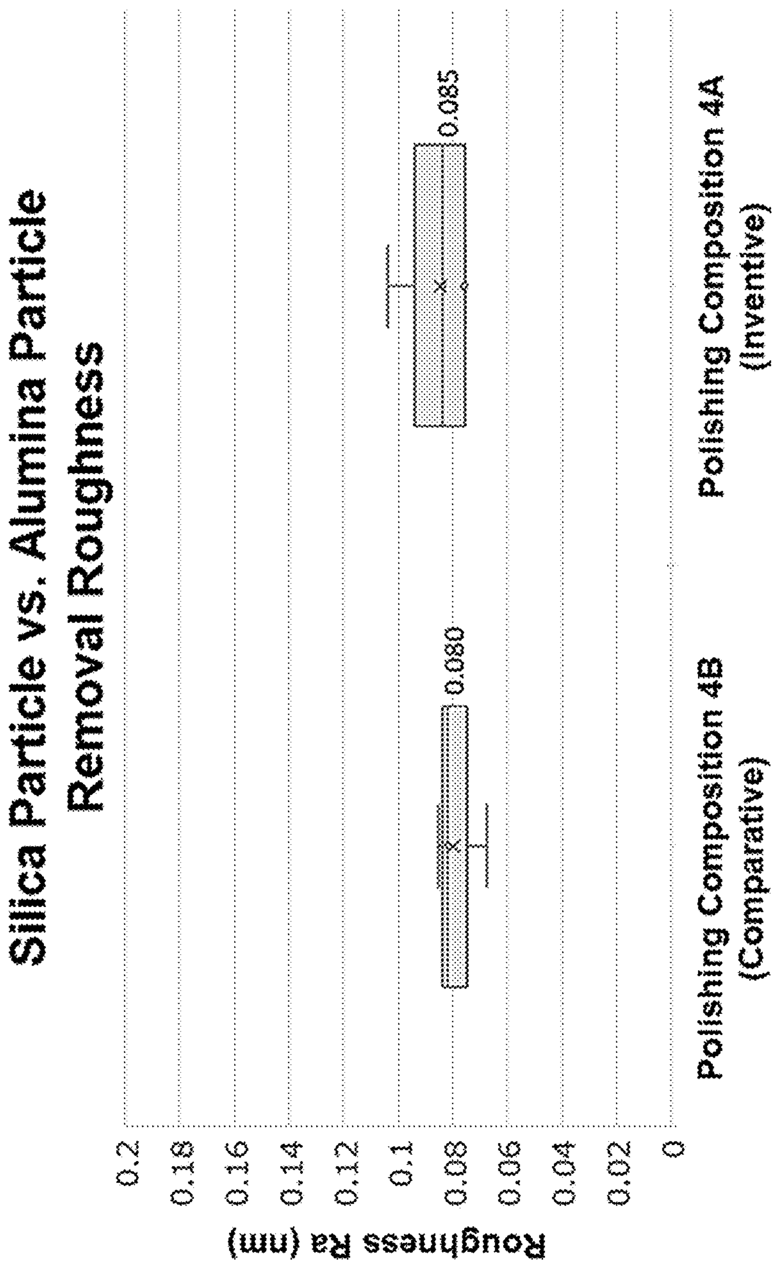
FIG. 6 shows the silicon carbide (SiC) removal roughness average (nm) for Polishing Composition 4A (Inventive) and Polishing Composition 4B (Comparative), as described in Example 4.
Figure 7:
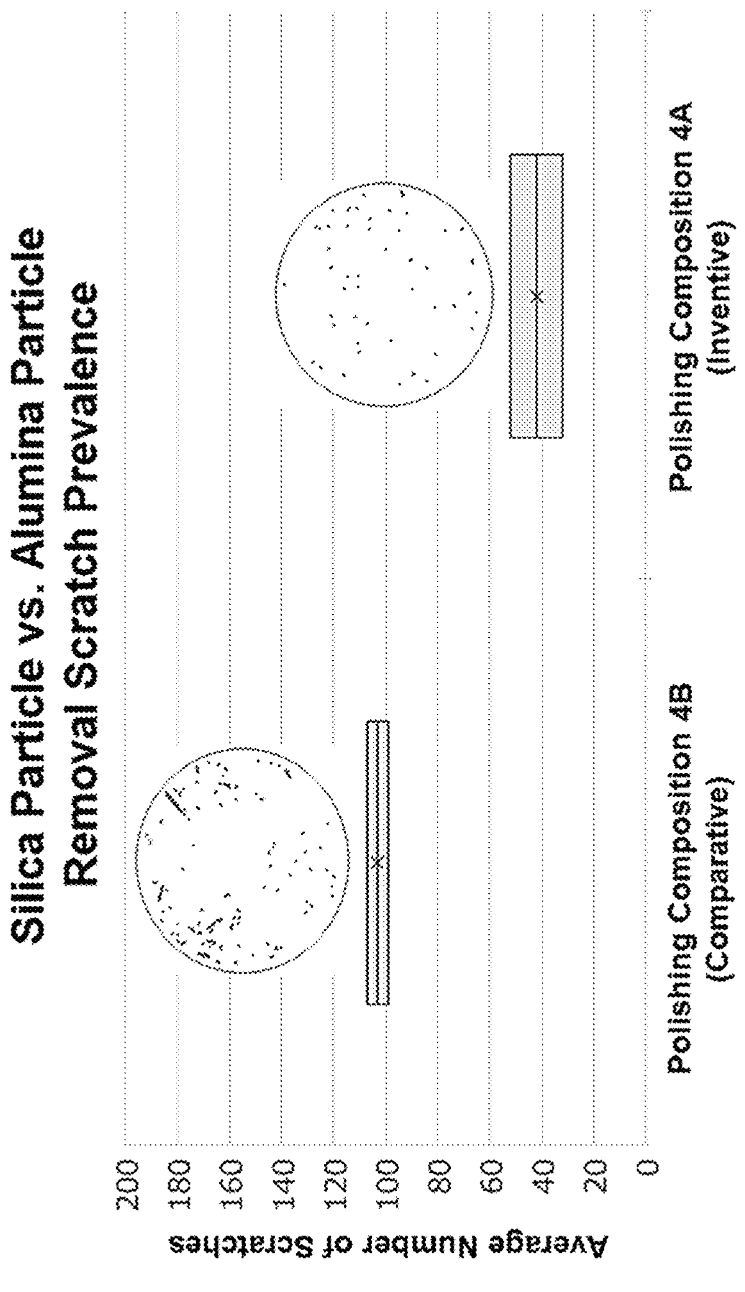
FIG. 7 shows the silicon carbide (SiC) removal scratch prevalence for Polishing Composition 4A (Inventive) and Polishing Composition 4B (Comparative), as described in Example 4.

As is apparent from the results set forth in Table 2 and FIGS. 5-7, inventive Polishing Composition 4A, comprising a surface-modified colloidal silica having a thin layer alumina coating and a positive native zeta potential, exhibited a silicon carbide removal rate and an average surface roughness that is comparable to the removal rate exhibited by comparative Polishing Composition 4B, however, polishing with inventive Polishing Composition 4A resulted in far fewer surface scratches than polishing with comparative Polishing Composition 4B. In other words, inventive Polishing Composition 4A, comprising a surface-modified colloidal silica having a thin layer alumina coating and a positive native zeta potential, desirably exhibits comparable polishing rates with less surface defects than comparative Polishing Composition 4B.

All references, including publications, patent applications, and patents, cited herein are hereby incorporated by reference to the same extent as if each reference were individually and specifically indicated to be incorporated by reference and were set forth in its entirety herein.

The use of the terms “a” and “an” and “the” and “at least one” and similar referents in the context of describing the invention (especially in the context of the following claims) are to be construed to cover both the singular and the plural, unless otherwise indicated herein or clearly contradicted by context. The use of the term “at least one” followed by a list of one or more items (for example, “at least one of A and B”) is to be construed to mean one item selected from the listed items (A or B) or any combination of two or more of the listed items (A and B), unless otherwise indicated herein or clearly contradicted by context. The terms “comprising,” “having,” “including,” and “containing” are to be construed as open-ended terms (i.e., meaning “including, but not limited to,”) unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., “such as”) provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate comprising:

(i) providing a substrate, wherein the substrate comprises a silicon carbide layer on a surface of the substrate, (ii) providing a polishing pad, (iii) providing a chemical-mechanical polishing composition comprising:

(a) an abrasive particle having a Mohs hardness of about 7 or less;

(b) an ionic oxidizer; and (c) water, wherein the chemical-mechanical polishing composition has a pH of about 1 to about 7, the abrasive particle has an isoelectric point that is higher than 8, and the ionic oxidizer has a negative charge at the pH of the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

2. The method of claim 1, wherein the polishing composition has a pH of about 3 to about 5.

3. The method of claim 1, wherein the polishing composition comprises about 0.001 wt. % to about 10 wt. % of the abrasive particle.

4. The method of claim 1, wherein the polishing composition comprises about 0.05 wt. % to about 5 wt. % of the abrasive particle.

5. The method of claim 1, wherein the abrasive particle has a Mohs hardness of about 6 or less.

6. The method of claim 1, wherein the abrasive particle has an isoelectric point of about 8.5 to about 10.

7. The method of claim 1, wherein the abrasive particle comprises silica, zirconia, ceria, or a combination thereof.

8. The method of claim 7, wherein the abrasive particle comprises surface-modified colloidal silica.

9. The method of claim 1, wherein the ionic oxidizer is oxone, cerium ammonium nitrate, a periodate, an iodate, a persulfate, a chlorate, a chromate, a permanganate, a bromate, a perbromate, a ferrate, a perrhenate, a perruthenate, or a combination thereof.

10. The method of claim 1, wherein the polishing composition further comprises an inorganic salt, wherein the inorganic salt is an aluminum-based inorganic salt.

* * * * *